(12) United States Patent
Mendolia et al.

(10) Patent No.: US 6,175,077 B1
(45) Date of Patent: Jan. 16, 2001

(54) SHIELD CAN HAVING TAPERED WALL ENDS FOR SURFACE MOUNTING AND RADIOTELEPHONES INCORPORATING SAME

(75) Inventors: Gregory S. Mendolia, Forest; Richard C. Lund, Spout Spring, both of VA (US)

(73) Assignee: Ericsson Inc., Research Triangle Park, NC (US)

(*) Notice: Under 35 U.S.C. 154(b), the term of this patent shall be extended for 0 days.

(21) Appl. No.: 09/246,971

(22) Filed: Feb. 9, 1999

(51) Int. Cl.[7] .................................................. H05K 9/00
(52) U.S. Cl. ............................................................ 174/35 R
(58) Field of Search .......................... 174/35 R, 35 MS; 361/816, 818, 753, 799, 800; 257/659, 660

(56) References Cited

U.S. PATENT DOCUMENTS

| | | | |
|---|---|---|---|
| 4,370,515 | 1/1983 | Donaldson | 174/35 |
| 4,754,101 | 6/1988 | Stickney et al. | 174/35 |
| 4,831,498 * | 5/1989 | Baba | 361/816 |
| 4,838,475 * | 6/1989 | Mullins et al. | 228/179 |
| 4,857,668 | 8/1989 | Buonanno | 174/35 |
| 4,890,199 * | 12/1989 | Beutler | 361/816 |
| 5,252,782 | 10/1993 | Cantrell et al. | 174/35 |
| 5,354,951 | 10/1994 | Lange, Sr. et al. | 174/35 |
| 5,508,889 | 4/1996 | Ii | 361/816 |
| 5,557,063 | 9/1996 | Mottahed | 174/35 |
| 5,579,212 | 11/1996 | Albano et al. | 361/820 |

FOREIGN PATENT DOCUMENTS

| | | | |
|---|---|---|---|
| 197 30 417 | 10/1998 | (DE) | H05K/7/08 |
| 5-82983 | 4/1993 | (JP) | 361/818 |

OTHER PUBLICATIONS

International Search Report for PCT US 00/00741; mailed May 8, 2000.
Announcing Printed Circuit Board Shielding from Instrument Specialties . . . an economical solution to your board level emission problems, New Product Bulletin (Series 97–2000), Instrument Specialities, 4 pages.
"Cho-Shield® EMI Shielding Covers," Technical Bulletin, Chomerics, Inc. 2 pages (1996).
"Style CBS Circuit Board Component Shielding," Guide 96, Leader Tech, pp. 1–6.

* cited by examiner

*Primary Examiner*—Kristine Kincaid
*Assistant Examiner*—Hung V Ngo
(74) *Attorney, Agent, or Firm*—Myers Bigel Sibley & Sajovec (57) ABSTRACT

Electromagnetic shielding devices are provided with walls having a pair of opposing, generally parallel side faces that terminate at a tapered end portion. Each tapered end portion is configured to be surface mounted to a respective conductive portion (e.g., mounting pad) of an electronic substrate via a pair of solder fillets. The tapered end portion of each wall includes a pair of elongate end faces symmetrical about a plane that is generally parallel to, and equidistant between, the wall side faces. The end faces define a pair of elongated cavities with respect to a PCB that are configured to receive the solder fillets.

28 Claims, 6 Drawing Sheets

FIG. 2B. (PRIOR ART) (BEFORE REFLOW)

FIG. 2C. (PRIOR ART) (AFTER REFLOW)

SHIELD CAN HAVING TAPERED WALL ENDS FOR SURFACE MOUNTING AND RADIOTELEPHONES INCORPORATING SAME

FIELD OF THE INVENTION

The present invention relates generally to shielding and, more particularly, to shielding devices for shielding electronic components or circuitry mounted on, or embedded in, printed circuit boards.

BACKGROUND OF THE INVENTION

Printed circuit boards (PCBs) are widely used electronic substrates in the electronics and telecommunications industry. PCBs generally include one or more layers of an insulating substrate (e.g., plastic) on which an electrical circuit is formed by depositing a predetermined pattern of a conducting metal (e.g., copper) for connecting various electronic components (e.g., semiconductors) which are mounted on or etched in the PCB layers. Many of these electrical circuits include components which operate at a high radio frequency (RF). The RF emissions from these components can interfere with the proper operation of other components or circuits in the vicinity of the PCB. Thus, it may be important to block or shield these RF emissions in order to prevent RF interference.

Conventionally, a metal "shield can," generally having the shape of an inverted open box, can be utilized to cover an electronic component or a specific portion of circuitry in or on a PCB which is causing RF interference. Shield cans are usually applied to the appropriate section of a PCB either by soldering or forced galvanic engagement. For proper and effective RF shielding, it is conventionally desired that a shield can uniformly contact a PCB. There may be little or no shielding of RF energy if gaps exist between the shield can and the PCB.

Figure 1A:
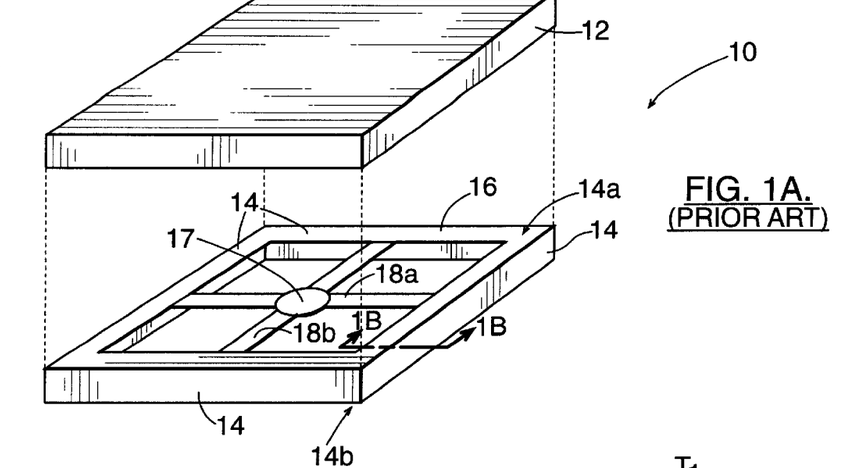
FIG. 1A illustrates a conventional shield can formed from sheet metal.

A conventional shield can 10, illustrated in FIG. 1A, includes a cover 12 and a plurality of side walls 14 formed from sheet metal. For rigidity, a lip 16 is formed around an upper portion 14a of each wall and a pair of cross members 18a, 18b are provided, as illustrated. The illustrated shield can 10 also includes a "pick-up-point" 17 located at the intersection of the cross members 18a, 18b that facilitates the placement of the side walls 14 by surface mount equipment. The cover 12 is attached at a later point in the manufacturing process.

Figure 1B:
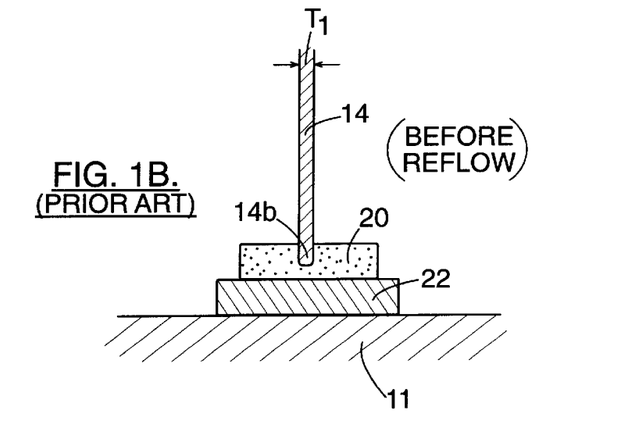
FIG. 1B is a side, cross-sectional view of a wall of the shield can of FIG. 1A placed within solder paste on a mounting pad.
Figure 1C:
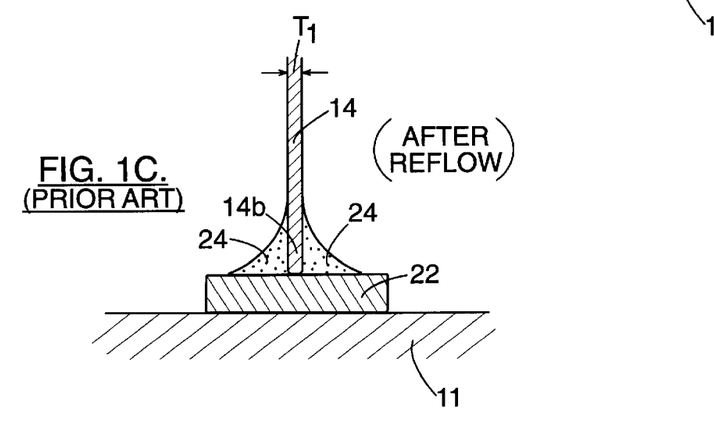
FIG. 1C is a side, cross-sectional view of a wall of the shield can of FIG. 1A after reflow of the solder paste illustrated in FIG. 1B.

To mount the illustrated shield can 10 on a PCB 11, a lower end portion 14b of each wall 14 is placed into a solder paste deposit 20 on a mounting pad 22, as illustrated in FIG. 1B. Heat is then applied to cause the solder paste 20 to reflow which produces the illustrated solder joints (also referred to as "fillets") 24 in FIG. 1C. When cooled, each fillet 24 can provide a bond between a mounting pad 22 and a respective wall 14. The cover 12 is configured to be secured to the upper portions 14a of the walls 14 to enclose a portion of a PCB. Unfortunately, the lip 16 and cross members 18a, 18b can hinder inspection and re-work performed on soldered components under these features, and/or removal of the shield can 10 at a later time.

For a shield can wall formed from sheet metal to be properly soldered to a PCB, it is typically important that the sheet metal be substantially flat, both initially when the side wall is formed, and during reflow operations. Unfortunately, heat from reflow operations may cause sheet metal to warp. This may result in gaps between a shield can wall and a PCB which may threaten the effectiveness of the shield can in blocking RF emissions. The presence of gaps may require costly re-work to properly solder a wall to a PCB.

Figure 2A:
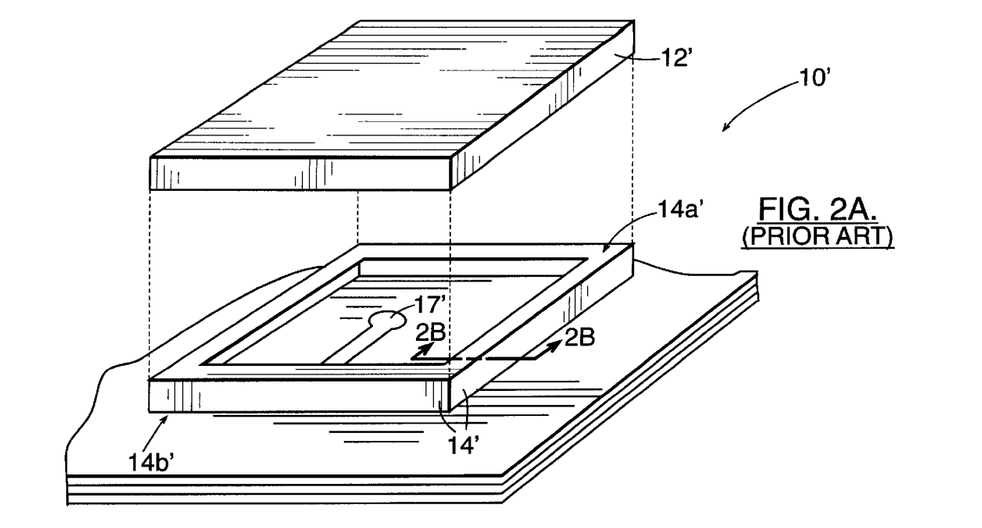
FIG. 2A illustrates a conventional molded shield can having walls thicker than sheet metal.
Figures 2B, 2C:
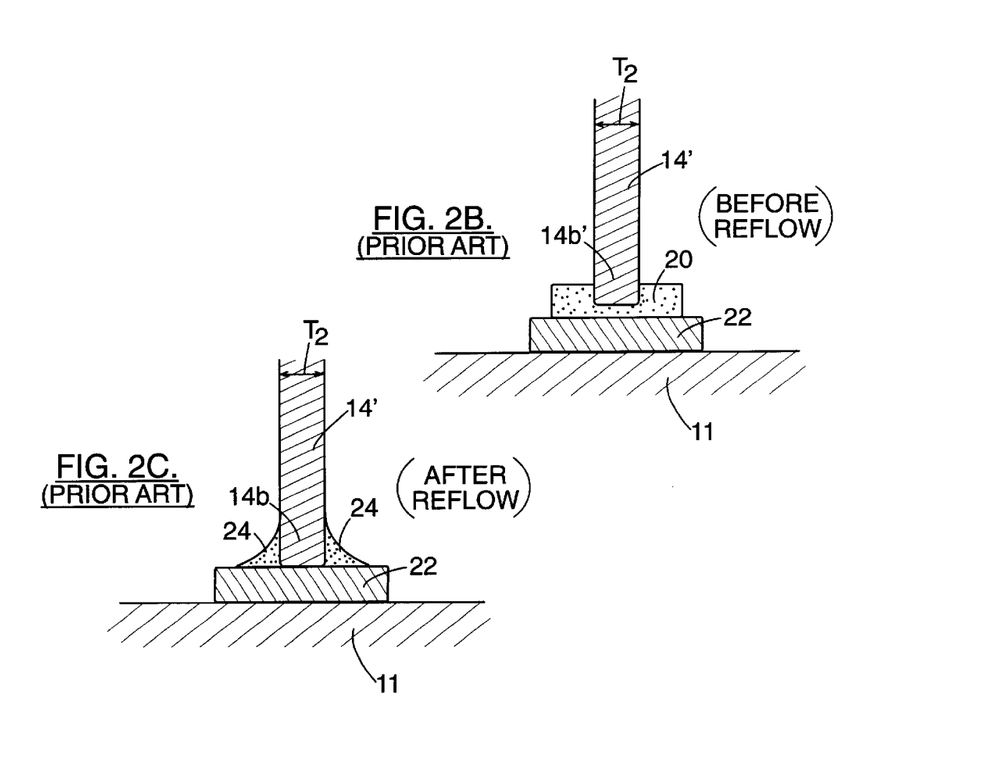
FIG. 2B is a side, cross-sectional view of a wall of the shield can of FIG. 2A placed within solder paste on a mounting pad.
FIG. 2C is a side, cross-sectional view of a wall of the shield can of FIG. 2A after reflow of the solder paste illustrated in FIG. 2B.

A conventional molded shield can 10' that is often preferred over shield cans formed from sheet metal is illustrated in FIG. 2A. The illustrated molded shield can 10' includes a cover 12' and a plurality of molded side walls 14', and a pickup point 17' for surface mount equipment. As illustrated in FIG. 2B, each side wall 14' of the molded shield can 10' has a thickness $T_2$ greater than a thickness $T_1$ of the sheet metal walls 14 of the shield can 10 illustrated in FIGS. 1A–1C (i.e., $T_2 > T_1$).

To mount the molded shield can 10' of FIG. 2A on a PCB, a lower end portion 14b' of each wall 14' is placed within solder paste 20 on a mounting pad 22, as illustrated in FIG. 2B. Heat is then applied to cause the solder paste 20 to reflow which produces the illustrated solder fillets 24 in FIG. 2C. When cooled, each fillet 24 can provide a bond between a mounting pad 22 and a respective wall 14'. The cover 12' is configured to be secured to the upper portions 14a' of the walls 14' to enclose a portion of a PCB 11.

By increasing the thickness of each wall 14', the need for a lip and cross members to provide rigidity can be eliminated. As a result, any additional re-work can be performed without hindrance therefrom. Molded shield cans are also preferred because a mold can be cost-effectively prepared for complex shapes and configurations that may be otherwise difficult into which to form sheet metal.

Unfortunately, molded shield cans having thicker walls may utilize significantly more PCB space than shield cans with walls formed from sheet metal. For electronic devices, such as radiotelephones and other communication devices where PCB space is limited, molded shield cans having walls thicker than sheet metal may be impractical or may compromise design/component spacing.

SUMMARY OF THE INVENTION

In view of the above, it is therefore an object of the present invention to facilitate the use of molded shield cans within electronic devices, such as radiotelephones, where PCB space is limited.

It is another object of the present invention to facilitate reducing the width of mounting pads that are used to secure shield can walls to a PCB.

It is yet another object of the present invention to facilitate the use of shield cans within electronic devices, such as radiotelephones, that do not require reinforcing members.

These and other objects of the present invention are provided by an electromagnetic shielding apparatus, such as a shield can, that includes tapered wall end portions having one or more cavities configured to receive a solder fillet therewithin. According to one embodiment of the present invention, a shield can may include an electrically conductive cover and a molded, electrically conductive frame. The frame includes a plurality of elongate metal walls. Each wall includes a pair of opposing, generally parallel side faces that terminate at a tapered end portion. Each tapered end portion is configured to be surface mounted to a respective conductive portion (e.g., mounting pad) of an electronic substrate via solder. The cover is configured to be removably secured to the frame to define an enclosure for shielding electronic components and/or circuitry.

The tapered end portion of each wall includes a pair of elongate end faces symmetrical about a plane that is generally parallel to, and equidistant between, the wall side faces. The end faces abut each other to form a tip. Each end face also abuts a respective edge of the respective side faces. The end faces define a pair of elongated cavities with respect to a conductive portion of the PCB. Each cavity is configured to receive solder therewithin for securing the wall to the conductive portion of the PCB.

According to another embodiment of the present invention, a shield can may include a top and a plurality of walls depending therefrom. Each wall includes a tapered end portion having one or more cavities configured to receive solder therewithin to secure the wall to a conductive portion of a PCB.

Shield cans incorporating the present invention can be advantageous because walls thereof can be formed from material thicker than sheet metal, and thus can be sufficiently rigid without requiring additional reinforcing members. Furthermore, the shape of a solder fillet contained within a tapered end portion cavity according to the present invention may not consume as much PCB surface space as conventional solder fillets. In addition, solder fillets produced via the present invention may be stronger than conventional solder fillets because more vertical wicking of the solder may occur over more wall surface area than with conventional shield can walls.

BRIEF DESCRIPTION OF THE DRAWINGS

The accompanying drawings, which are incorporated in and constitute a part of the specification, illustrate embodiments of the invention and, together with the description, serve to explain principles of the invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Radiotelephones generally refer to communications terminals which provide a wireless communications link to one or more other communications terminals. Radiotelephones may be used in a variety of different applications, including cellular telephone, land-mobile (e.g., police and fire departments), and satellite communications systems.

Figure 3:
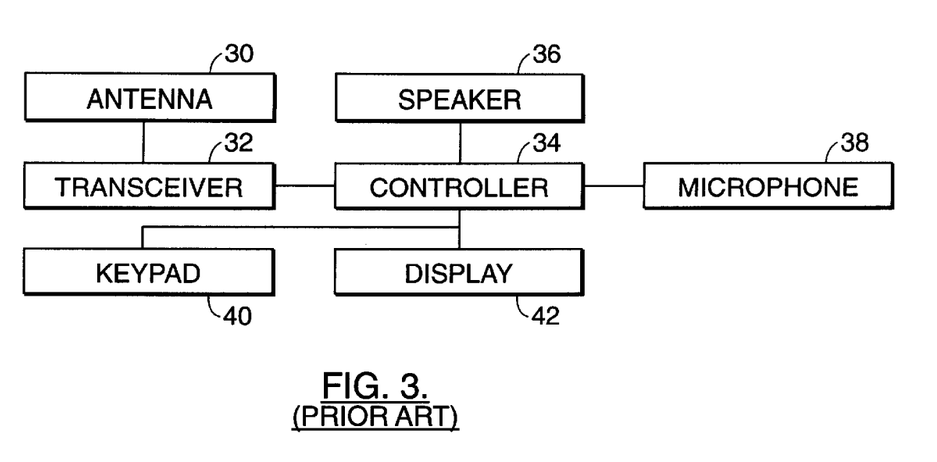
FIG. 3 is a schematic illustration of a conventional arrangement of electronic components for enabling a radiotelephone to transmit and receive telecommunications signals.

A conventional arrangement of electronic components that enable a radiotelephone to transmit and receive radiotelephone communication signals is shown schematically in FIG. 3, and is understood by those skilled in the art of radiotelephone communications. An antenna 30 for receiving and transmitting radiotelephone communication signals is electrically connected to a radio-frequency transceiver 32 that is further electrically connected to a controller 34, such as a microprocessor. The controller 34 is electrically connected to a speaker 36 that transmits a remote signal from the controller 34 to a user of a radiotelephone. The controller 34 is also electrically connected to a microphone 38 that receives a voice signal from a user and transmits the voice signal through the controller 34 and transceiver 32 to a remote device. The controller 34 is electrically connected to a keypad 40 and display 42 that facilitate radiotelephone operation. Other elements of radiotelephones are conventional and need not be described herein.

Figure 4:
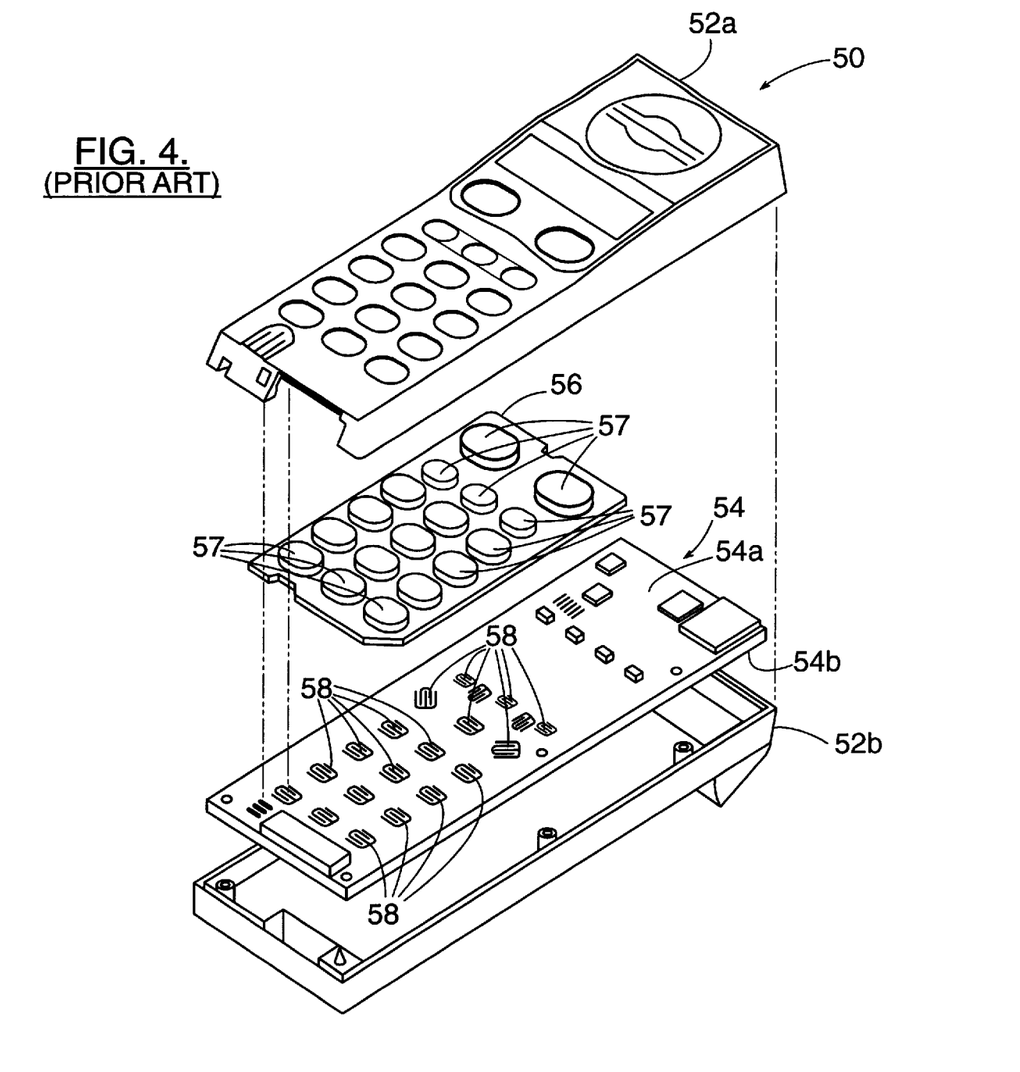
FIG. 4 is an exploded perspective view of a circuit board and keypad contained within the housing of a radiotelephone.

Referring now to FIG. 4, an exploded perspective view is provided of various components of a radiotelephone 50. Upper housing portion 52a and lower housing portion 52b are configured to enclose various internal components. Illustrated internal components include an electronic substrate such as a PCB 54 and keypad 56. As is known to those skilled in the art, various electronic components that enable the radiotelephone 50 to transmit and receive telecommunications signals are mounted on the PCB 54. The illustrated PCB 54 includes opposing first and second faces 54a, 54b. Most electronic components are attached to the second face 54b of the illustrated PCB 54 because contact pads 58 that are configured to be engaged by keys 57 of the keypad 56 are located on the circuit board first face 54a. Shield cans according to the present invention may be used to shield electronic components or circuitry mounted on (or embedded within) the first and second faces 54a, 54b of the illustrated PCB 54.

Figure 5:
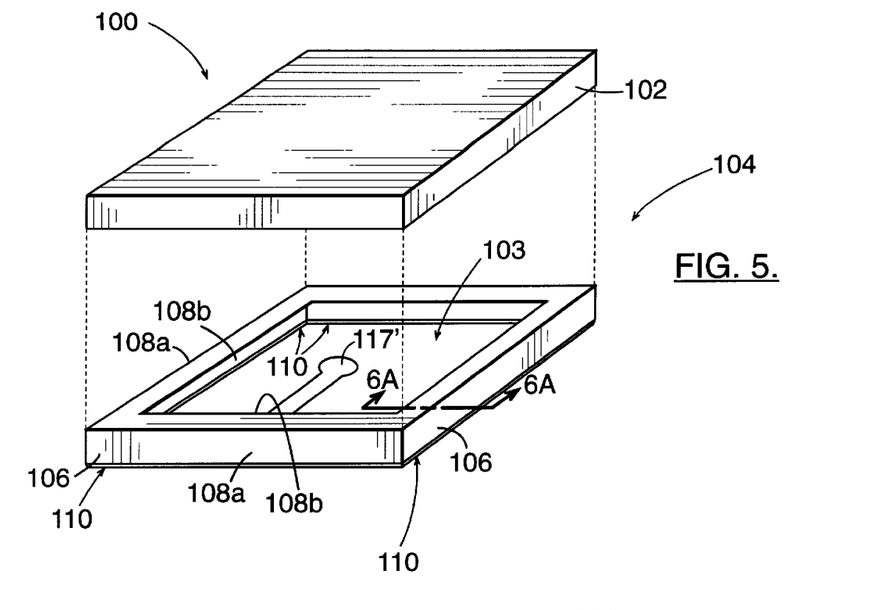
FIG. 5 illustrates a molded shield can having walls with tapered end portions according to an embodiment of the present invention.

Referring now to FIG. 5, a shield can 100, according to an embodiment of the present invention, is illustrated. The illustrated shield can 100 includes an electrically conductive cover 102, a molded, electrically conductive frame 104, and a pickup point 117 for use by surface mount equipment. The frame 104 includes a plurality of elongate metal walls 106. Each wall 106 includes a pair of opposing, generally parallel side faces 108a, 108b that terminate at a tapered end portion 110. Each tapered end portion 110 is configured to be surface mounted to a respective conductive mounting pad (or other conductive portion) on an electronic substrate (i.e., a PCB) via a pair of solder fillets. The cover 102 is configured to be removably secured to the frame 104 to define an enclosure 103 for shielding electronic components and/or circuitry.

Figures 6A, 6B:
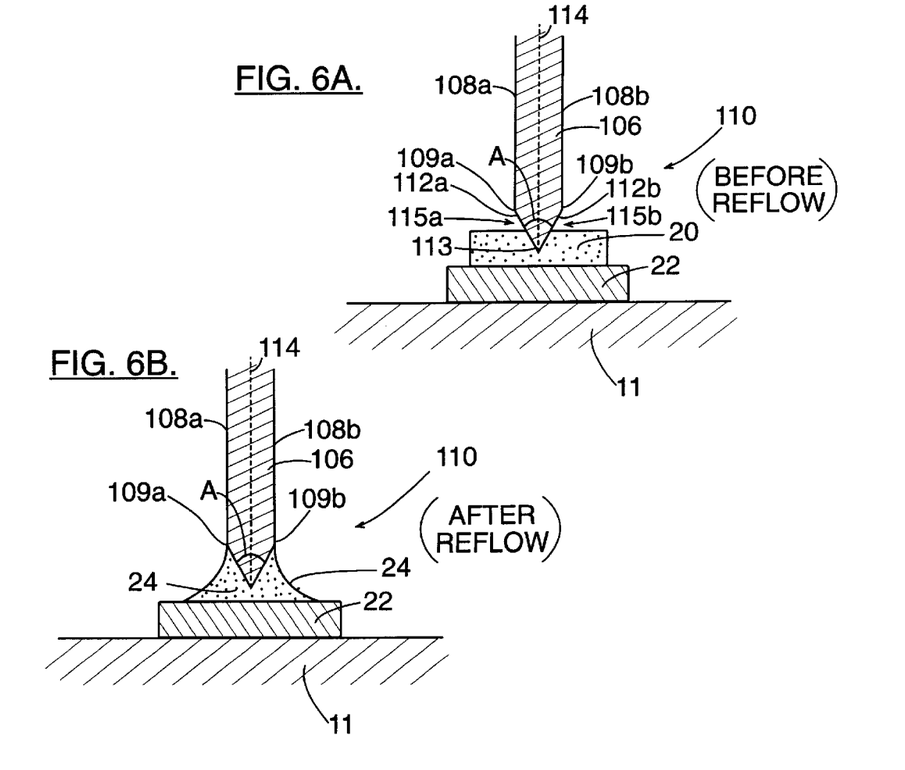
FIG. 6A is an enlarged, cross-sectional view of a wall of the molded shield can of FIG. 5, taken along lines 6A—6A, and illustrating a tapered lower end portion of the wall, according to an embodiment of the present invention, placed within solder paste on a mounting pad.
FIG. 6B illustrates the tapered lower end portion of the molded shield can wall of FIG. 6A after solder paste reflow whereupon the wall is secured to the mounting pad via solder fillets.

Referring now to FIG. 6A, an enlarged, cross-sectional view of a wall 106 of the molded shield can 100 of FIG. 5, taken along lines 6A—6A and illustrating a tapered end portion 110 of the wall 106, according to an embodiment of the present invention, is illustrated. The tapered end portion 110 is shown embedded within solder paste 20 on a conductive mounting pad 22 of a PCB 11.

The tapered end portion 110 of each wall 106 of the illustrated shield can 100 includes a pair of elongate end faces 112a, 112b that are symmetrical about a plane 114 that is generally parallel to, and equidistant between, the side faces 108a, 108b of the wall 106. The end faces 112a, 112b abut to form a tip 113, as illustrated. The abutting end faces 112a, 112b preferably form an angle A of between about five degrees (5°) and about forty-five degrees (45°).

Each end face 112a, 112b also abuts a respective edge 109a, 109b of the respective side faces 108a, 108b as illustrated. The end faces 112a, 112b define a pair of elongated cavities 115a, 115b with respect to the conductive mounting pad 22, as illustrated. Each cavity 115a, 115b is configured to receive a respective solder fillet 24 therewithin for securing the wall 106 to the conductive mounting pad 22.

The present invention is not limited to the illustrated configuration and shape of the wall tapered end portion 110. Other shapes and configurations that provide one or more cavities for receiving a solder fillet may be utilized without departing from the spirit and intent of the present invention. For example, the tip 113 may have a flat configuration or may have a round or radiused configuration.

The cover 102 and frame 104 of the illustrated shield can 100 are preferably formed from material having a higher melting point than a melting point of the solder paste 20. Preferably, the cover 102 and frame 104 are formed from polymeric material coated with an outer layer of conductive material.

Referring now to FIG. 6B, the solder paste 20 illustrated in FIG. 6A has been subjected to reflow conditions to create solder fillets 24 within the cavities 115a, 115b (FIG. 6A) that secure the wall tapered end portion 110 to the conductive mounting pad 22. Reflow solder techniques, which permit multiple components to be soldered in place at once, are known to those skilled in this art and need not be described further herein. Each solder fillet 24 is substantially tucked below the wall 106, as illustrated. As a result, lateral space on the conductive mounting pad 22, and thus, the PCB 11, is conserved. Shield cans having walls with tapered end portions according to the present invention can utilize smaller conductive mounting pads than are possible with conventional shield cans. As a result, the present invention facilitates the conservation of PCB surface area.

In addition, the tapered end configuration of a shield can wall, according to the present invention, allows for more vertical wicking of solder over a greater wall surface area than with conventional shield can walls. As a result, a joint between a shield can wall incorporating the present invention and a PCB can improve the rigidity of a shield can.

Figure 7A:
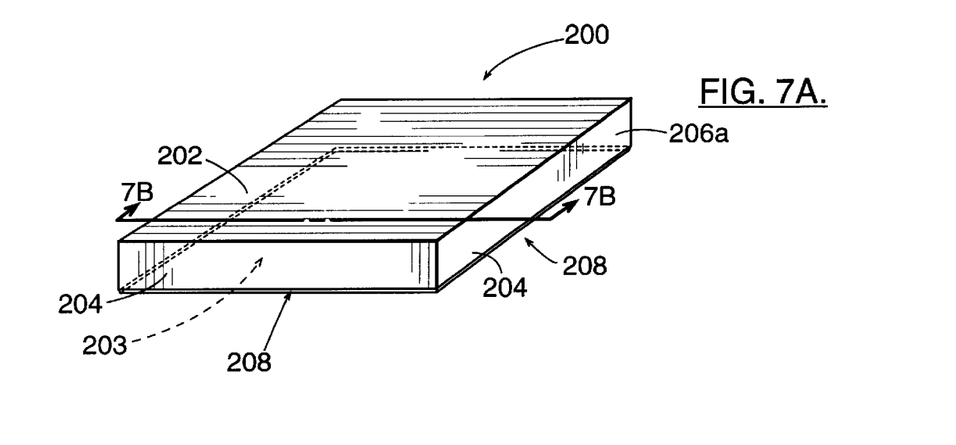
FIG. 7A illustrates a molded shield can according to another embodiment of the present invention including a cover and integral walls depending therefrom with tapered end portions.
Figure 7B:
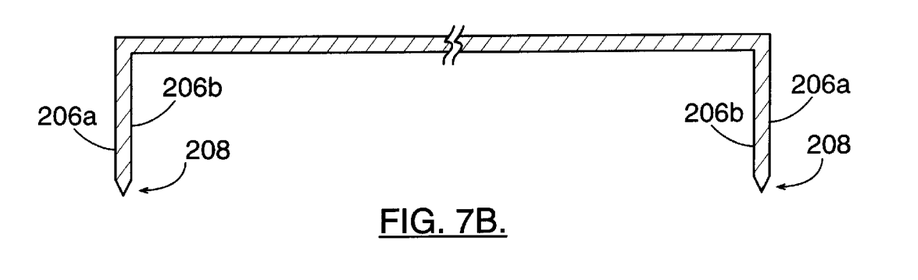
FIG. 7B is a cross-sectional view of the molded shield can of FIG. 7A taken along lines 7B—7B.

Referring now to FIGS. 7A and 7B, a shield can 200 according to another embodiment of the present invention is illustrated. The illustrated shield can 200 includes an electrically conductive top 202 and a plurality of elongate, electrically conductive side walls 204 integrally formed with, and depending from, the top 202 to define a cavity 203 for enclosing electronic components and/or circuitry. Each side wall 204 includes a pair of opposing, generally parallel side faces 206a, 206a that terminate at a tapered end portion 208 opposite the top 202. The tapered end portion 208 is configured to be surface mounted to a conductive mounting pad or other conductive portion of an electronic substrate via at least one solder fillet as described above. The tapered end portion 208 is similar to the tapered end portion illustrated in FIGS. 6A and 6B above.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within-the scope of the appended claims. The invention is defined by the following claims, with equivalents of the claims to be included therein.

That which is claimed is:

1. An electromagnetic shielding apparatus, comprising:
    an electrically conductive frame having peripheral walls and opposite first and second open ends;
    wherein each peripheral wall comprises:
        a pair of opposite side faces terminating at a tapered end portion that is configured to be soldered to a conductive portion of an electronic substrate;
        wherein a cross-sectional dimension of the tapered end portion decreases in a direction towards the conductive portion to define at least one cavity with respect to the conductive portion; and
        wherein the cavity is configured to receive solder therewithin for securing the tapered end portion to the conductive portion; and
    an electrically conductive cover configured to be secured to the frame to cover the first opening and thereby define an enclosure.

2. An electromagnetic shielding apparatus according to claim 1 wherein the side faces of each wall are generally parallel.

3. An electromagnetic shielding apparatus according to claim 2 wherein the tapered end portion of each wall comprises a pair of elongate end faces symmetrical about a plane generally parallel to and equidistant between the side faces of a respective wall, and wherein each end face in the pair abuts an edge of the corresponding end face of the pair and also abuts an edge of a respective side face.

4. An electromagnetic shielding apparatus according to claim 3 wherein the abutting end faces form an angle of between about 5 degrees and about 45 degrees.

5. An electromagnetic shielding apparatus according to claim 1 wherein each wall is formed from material having a higher melting point than a melting point of solder.

6. An electromagnetic shielding apparatus according to claim 1 wherein the cover and frame are formed from metalized polymeric material.

7. An electromagnetic shielding apparatus according to claim 1 wherein the conductive portion of the electronic substrate comprises a conductive mounting pad.

8. An electromagnetic shielding apparatus, comprising:
an electrically conductive frame, comprising:
a plurality of elongate metal walls;
wherein each wall includes a pair of opposing, generally parallel side faces terminating at a tapered end portion configured to be surface mounted to a respective conductive mounting pad on an electronic substrate via solder;
wherein the tapered end portion of each wall comprises a pair of elongate end faces symmetrical about a plane generally parallel to and equidistant between the side faces of a respective wall;
wherein each end face in the pair abuts an edge of the corresponding end face of the pair and also abuts an edge of a respective side face to define a pair of cavities with respect to a respective conductive mounting pad; and
wherein each cavity in the pair is configured to receive solder therewithin for securing a respective wall to a respective conductive mounting pad; and
an electrically conductive cover configured to be secured to the frame to define an enclosure.

9. An electromagnetic shielding apparatus according to claim 8 wherein the abutting end faces form an angle of between about 5 degrees and about 45 degrees.

10. An electromagnetic shielding apparatus according to claim 8 wherein each wall is formed from material having a higher melting point than a melting point of solder.

11. An electronic apparatus, comprising:
an electronic substrate; and
an electromagnetic shielding apparatus secured to the electronic substrate, comprising:
a frame, comprising:
a plurality of elongate electrically conductive walls;
wherein each wall includes a pair of opposing side faces terminating at a tapered end portion;
wherein each tapered end portion is secured to a respective conductive mounting pad on the electronic substrate via solder; and
wherein a cross-sectional dimension of each tapered end portion decreases in a direction towards a respective conductive mounting pad to define a cavity configured to receive solder therewithin; and
an electrically conductive cover secured to the frame to define an enclosure.

12. An electronic apparatus according to claim 11 wherein the side faces of each wall are generally parallel.

13. An electronic apparatus according to claim 12 wherein the tapered end portion of each wall comprises a pair of elongate end faces symmetrical about a plane generally parallel to and equidistant between the side faces of a respective wall, and wherein each end face in the pair abuts an edge of the corresponding end face of the pair and also abuts an edge of a respective side face.

14. An electronic apparatus according to claim 13 wherein the abutting end faces form an angle of between about 5 degrees and about 45 degrees.

15. An electronic apparatus according to claim 12 wherein the solder is substantially contained within the cavity.

16. An electronic apparatus according to claim 12 wherein each wall is formed from material having a higher melting point than a melting point of the solder.

17. An electronic apparatus according to claim 12 wherein the cover and each wall are formed from metalized polymeric material.

18. An electronic apparatus according to claim 12 wherein the electronic apparatus is a radiotelephone.

19. An electronic apparatus, comprising:
an electronic substrate; and
an electromagnetic shielding apparatus secured to the electronic substrate, comprising:
an electrically conductive frame, comprising:
a plurality of elongate metal walls;
wherein each wall includes a pair of opposing, generally parallel side faces terminating at a tapered end portion;
wherein each tapered end portion is secured to a respective conductive mounting pad on the electronic substrate via solder;
wherein the tapered end portion of each wall comprises a pair of elongate end faces symmetrical about a plane generally parallel to and equidistant between the side faces of a respective wall;
wherein each end face in the pair abuts an edge of the corresponding end face of the pair and also abuts an edge of a respective side face to define a pair of cavities with respect to a respective conductive mounting pad; and
wherein each cavity is configured to contain solder therewithin; and
an electrically conductive cover secured to the frame to define an enclosure.

20. An electronic apparatus according to claim 19 wherein the abutting end faces form an angle of between about 5 degrees and about 45 degrees.

21. An electromagnetic shielding apparatus according to claim 19 wherein each wall is formed from material having a higher melting point than a melting point of the solder.

22. An electronic apparatus according to claim 19 wherein solder is substantially contained within a respective cavity.

23. An electronic apparatus according to claim 19 wherein the electronic apparatus is a radiotelephone.

24. An electronic substrate, comprising:
an elongate conductive mounting pad disposed on the electronic substrate; and
an elongate, electrically conductive wall secured to the conductive mounting pad, comprising:
a pair of opposing, generally parallel side faces terminating at a tapered end portion, wherein a cross-sectional dimension of the tapered end portion decreases in a direction towards the conductive mounting pad to define a cavity with respect to the conductive mounting pad, wherein the tapered end portion comprises a pair of elongate, planar end faces symmetrical about a plane generally parallel to and equidistant between the side faces, wherein each planar end face abuts an edge of the corresponding planar end face of the pair and also abuts an edge of a respective side face, and wherein the tapered end portion is secured to the conductive mounting pad via solder disposed within the cavity.

25. An electronic substrate according to claim 24 wherein the abutting planar end faces form an angle of between about 5 degrees and about 45 degrees.

26. An electronic substrate according to claim 25 wherein the wall is formed from material having a higher melting point than a melting point of the solder.

27. An electronic substrate according to claim 26 wherein the wall is formed from metalized polymeric material.

28. An electronic substrate according to claim 24 wherein the solder is substantially contained within the cavity.

* * * * *

UNITED STATES PATENT AND TRADEMARK OFFICE
CERTIFICATE OF CORRECTION

PATENT NO.     : 6,175,077 B1                                                    Page 1 of 1
DATED          : January 16, 2001
INVENTOR(S)    : Mendolia et al.

It is certified that error appears in the above-identified patent and that said Letters Patent is hereby corrected as shown below:

Column 8,
Line 59, please change "claim 25" to -- claim 24 --.

Signed and Sealed this

Twenty-second Day of October, 2002

Attest:

Attesting Officer

JAMES E. ROGAN
Director of the United States Patent and Trademark Office